(12) United States Patent
Petitprez

(10) Patent No.: US 8,848,417 B2
(45) Date of Patent: Sep. 30, 2014

(54) INTEGRATED CIRCUIT WITH A SELF-PROGRAMMED IDENTIFICATION KEY

(75) Inventor: Emmanuel Petitprez, Grenoble (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 154 days.

(21) Appl. No.: 13/607,578

(22) Filed: Sep. 7, 2012

(65) Prior Publication Data
US 2013/0083586 A1 Apr. 4, 2013

(30) Foreign Application Priority Data

Sep. 29, 2011 (FR) ...................................... 11 58734

(51) Int. Cl.
| | |
|---|---|
| G11C 17/04 | (2006.01) |
| H01L 23/00 | (2006.01) |
| H01L 23/544 | (2006.01) |
| H01L 23/525 | (2006.01) |
| H01L 49/02 | (2006.01) |
| H01L 23/522 | (2006.01) |

(52) U.S. Cl.
CPC ........... *H01L 23/544* (2013.01); *H01L 2924/14* (2013.01); *H01L 28/40* (2013.01); *H01L 23/576* (2013.01); *H01L 23/5223* (2013.01); *H01L 2223/5444* (2013.01); *H01L 2223/5448* (2013.01); *H01L 23/5252* (2013.01)
USPC ........................ 365/102; 365/149; 365/185.04

(58) Field of Classification Search
CPC ......... G11C 17/04; G11C 11/24; H01L 21/02
USPC ..................... 365/102, 149, 185.04
See application file for complete search history.

(56) References Cited

U.S. PATENT DOCUMENTS

| | | | |
|---|---|---|---|
| 5,056,061 A | 10/1991 | Akylas et al. | |
| 6,180,976 B1 | 1/2001 | Roy | |
| 6,278,172 B1 | 8/2001 | Tominaga | |
| 6,504,202 B1 | 1/2003 | Allman et al. | |
| 6,916,722 B2 | 7/2005 | Huang et al. | |
| 6,985,387 B2* | 1/2006 | Chen et al. ............... | 365/189.15 |
| 7,321,502 B2* | 1/2008 | Paillet et al. .................. | 365/102 |
| 2007/0108615 A1 | 5/2007 | Lin et al. | |
| 2008/0028349 A1 | 1/2008 | Muranaka | |
| 2011/0254141 A1 | 10/2011 | Roest et al. | |

OTHER PUBLICATIONS

Sadeghi et al. (ed.), "Towards Hardware-Intrinsic Security," Part I—Physically Unclonable Functions (PUFs), Springer-Verlag Berlin Heidelberg, 2010, pp. 2-37.
Bierwagen, O. et al., "Leakage currents at crystallites in $ZrAl_xO_y$ thin films measured by conductive atomic-force microscopy," Applied Physics Letters 90, 232901-3, 2007.
Timma, a. et al., "Post Si(C)n. hillock nucleation and growth in Ic copper lines controlled by diffucional creep," Microelectronic Engineering 87, pp. 361-364, 2010.
Tsutsumi, T. et al., "Fabrication technology of ultrafine $SiO_2$ masks and Si nanowires using oxidation of vertical sidewalls of a poly-Si layer," J. Vac. Sci. Technol. B 17(1):77-81, Jan./Feb. 1999.

* cited by examiner

*Primary Examiner* — Tan T. Nguyen
(74) *Attorney, Agent, or Firm* — Seed IP Law Group PLLC

(57) ABSTRACT

A structure for storing a native binary code in an integrated circuit, including an array of planar MIM capacitors above an insulating layer formed above a copper metallization network, wherein at least one metallization portion is present under each MIM capacitor. The size of the portion(s) is selected so that from 25 to 75% of the MIM capacitors have a breakdown voltage smaller by at least 10% than that of the other MIM capacitors.

20 Claims, 4 Drawing Sheets

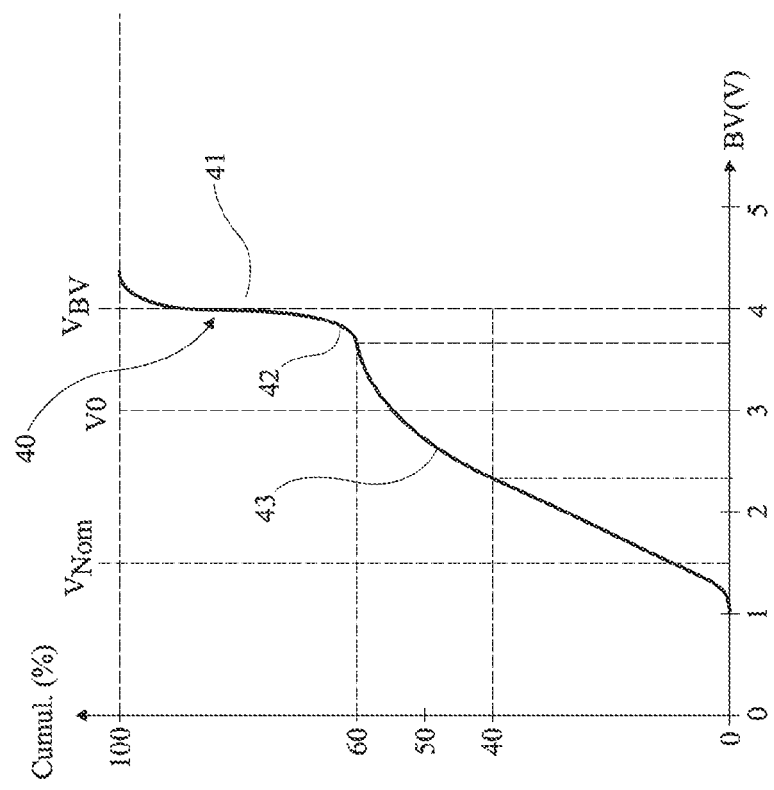
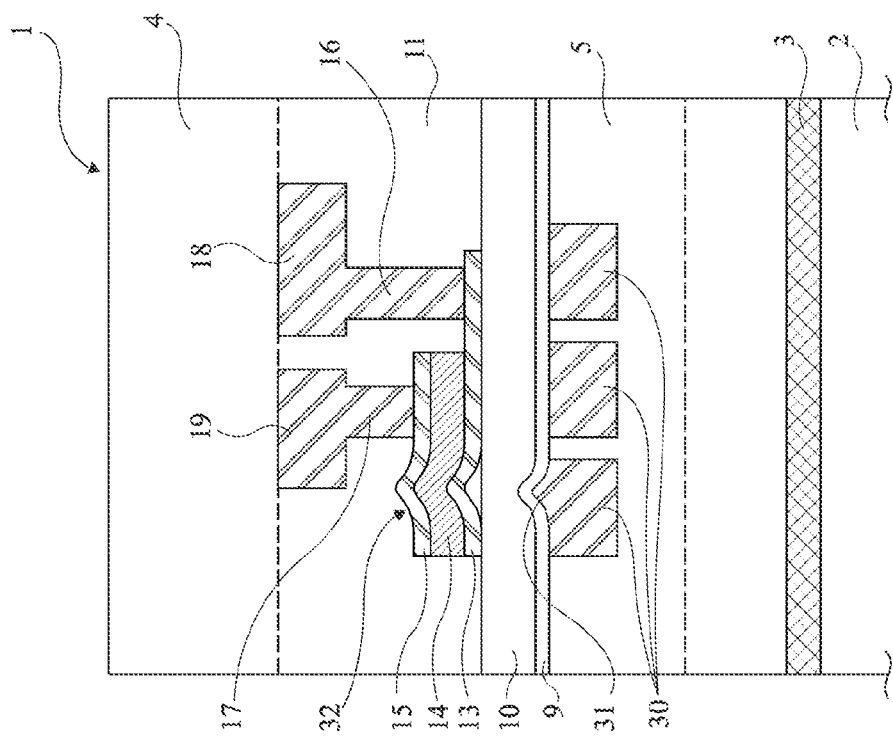
Fig 2A
Fig 2B

INTEGRATED CIRCUIT WITH A SELF-PROGRAMMED IDENTIFICATION KEY

BACKGROUND

1. Technical Field

The present disclosure relates to integrated circuits incorporating a code configured to identify or to authenticate the origin of these circuits. In particular, the present disclosure relates to integrated circuits for which this code is programmed in non-deterministic fashion, so that it is difficult or even impossible to make a copy of the integrated circuit including its code.

2. Description of the Related Art

Digital keys are especially exchanged over the Internet and used in identification protocols controlling financial transactions, the provision of e-services, contactless payments, the access to critical data, etc. To reinforce the security of such transactions, the digital keys are currently stored in a dedicated integrated circuit such as that of a chip card, for example, in an OTP-type (one-time programmable) non-volatile memory. One must then be physically in possession of this dedicated circuit to be authenticated. The counterfeiting of such circuits thus is a major security issue regarding this so-called "hardware" approach. Indeed, if, by any means, one can access the code of an authentic chip or intercept such a code, and if one has a blank counterfeit chip in one's possession, it becomes possible to program the latter identically to the authentic chip.

There thus is a need for integrated circuits incorporating a forgery-proof digital signature. Such signatures may be obtained by taking advantage of the intrinsic dispersion of physical or electric features of elementary components of an integrated circuit, such as transistors, interconnects, capacitors, etc. . . . , and are the base of the concept of Physical Unclonable Function, better known as PUF, which concept has for example been developed by A.-R. Sadeghi and D. Naccache in their work "Towards Hardware-Intrinsic Security", Springer, 1st Edition, 2010.

Such dispersions of parameters of elementary components of an integrated circuit originate from the inevitable dimension, thickness, and physico-chemical fluctuations of the materials used, which are inherent to manufacturing processes. Such fluctuations being in practice non-deterministic, a code which is generated based on such fluctuations would be pseudo-random and it would be difficult, or even impossible, to copy a chip having a same native code, short of replacing the corresponding circuit block with a block mimicking the original block and its code. Such a strategy is theoretically possible but in practice very expensive for the counterfeiter, which makes it less advantageous.

The original circuit manufacturer can extract this native code at the end of the manufacturing process and can thus keep up to date a register of the signature of the authentic circuits that are distributed. The signature of a circuit may then be checked in various occasions to authenticate the origin of the circuit: by the end customer, by the manufacturer in case of a return of goods, by the operating system of a computer incorporating the circuit, etc.

To implement such physical unclonable functions or PUFs, it has been provided (WO2010/076733) to form a network of metal-insulator-metal capacitors (or MIM capacitors) having identical dimensions but where the insulator is intentionally roughened to locally vary the capacitance value. The code is then formed by all the electric capacitance values of the capacitors. Such a solution has the disadvantage that these values are continuous values and must be digitized to form a digital code exploitable by a program. On the other hand, the aging and the degradation of the dielectric may result in an alteration of the code over time or according to the conditions of use of the circuit.

Other solutions have been provided, such as those exploiting the initialization values of SRAM cells on powering-on thereof, the dispersion of the threshold voltage of MOS transistors, of the frequency of ring oscillators, or of the propagation times of signals through logic gates. All these solutions have at least one of the two previously mentioned disadvantages, that is, they generate continuous analog values which must be previously digitized to obtain an exploitable binary code, or said code is unsteady by nature because it is sensitive to the aging of the circuit and to its conditions of use.

BRIEF SUMMARY

There thus is a need for integrated circuits incorporating a native binary time-steady signature.

One embodiment provides a structure for storing a native binary code in an integrated circuit, comprising an array of planar MIM capacitors above an insulating layer formed above a copper metallization network, wherein at least one metallization portion is present under each MIM capacitor and wherein the dimension of the portion(s) is selected so that from 25 to 75% of the MIM capacitors have a breakdown voltage smaller by at least 10% than that of the other MIM capacitors.

According to an embodiment, the metallization portion(s) correspond to copper lines extending parallel to the rows or columns of said array.

According to an embodiment, the storage structure comprises from two to five lines across the width of a MIM capacitor.

According to an embodiment, all the first electrodes of at least one subset of MIM capacitors are interconnected.

According to an embodiment, said subset corresponds to a row or to a column of the array.

According to an embodiment, all second electrodes of the MIM capacitors are connected to selection transistors via first resistors of same values.

According to an embodiment, the copper lines have a width greater than 1 µm, the spacing between lines being smaller than 0.5 µm, each of the capacitors having lateral dimensions ranging between 2 and 50 µm.

An embodiment provides a method for programming a native binary code in a structure such as hereabove, comprising the step of:

commonly connecting at least one subset of MIM capacitors of said array, in a circuit capable of causing a breakdown of said from 25 to 75% of the MIM capacitors.

According to an embodiment, the method comprises the steps of:

connecting the first electrodes of the capacitors to a first terminal of a voltage source, through a common resistor;

connecting the second electrodes of each of the capacitors to a second terminal of the voltage source, via individual resistors; and applying between the first and second terminals a voltage ranging between the breakdown voltages of said from 25 to 75% of the MIM capacitors and the breakdown voltages of said other MIM capacitors.

According to an embodiment, the product of the number of MIM capacitors by the ratio between the value of the common resistor and the value of an individual resistor is smaller than 0.1.

An embodiment provides a secure system comprising an integrated circuit provided with a structure such as hereabove, wherein the code generated and stored is used in a step of a protocol of authentication of said integrated circuit.

An embodiment provides a method for identifying an integrated circuit provided with a structure such as hereabove, wherein the native binary code is used as an identification number of said integrated circuit.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIG. 2A is a cross-section view of an integrated circuit comprising a metal-insulator-metal capacitor formed in metallization levels;

FIG. 2B is a graphic representation of the distribution of the breakdown voltages of an assembly of MIM capacitors such as shown in FIG. 2A;

DETAILED DESCRIPTION

Figure 1B:
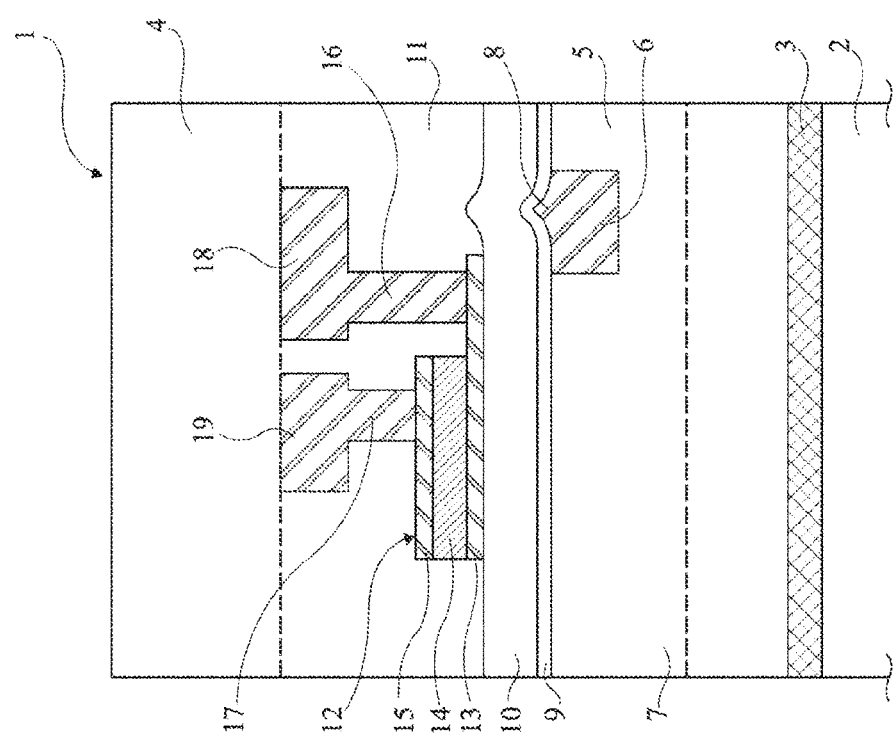
FIG. 1B is a graphic representation of the distribution of the breakdown voltages of an assembly of metal-insulator-metal capacitors such as shown in FIG. 1A.

For clarity, the same elements have been designated with the same reference numerals in the different drawings and, further, as usual in the representation of integrated circuits, the various drawings are not to scale.

Figure 1A:
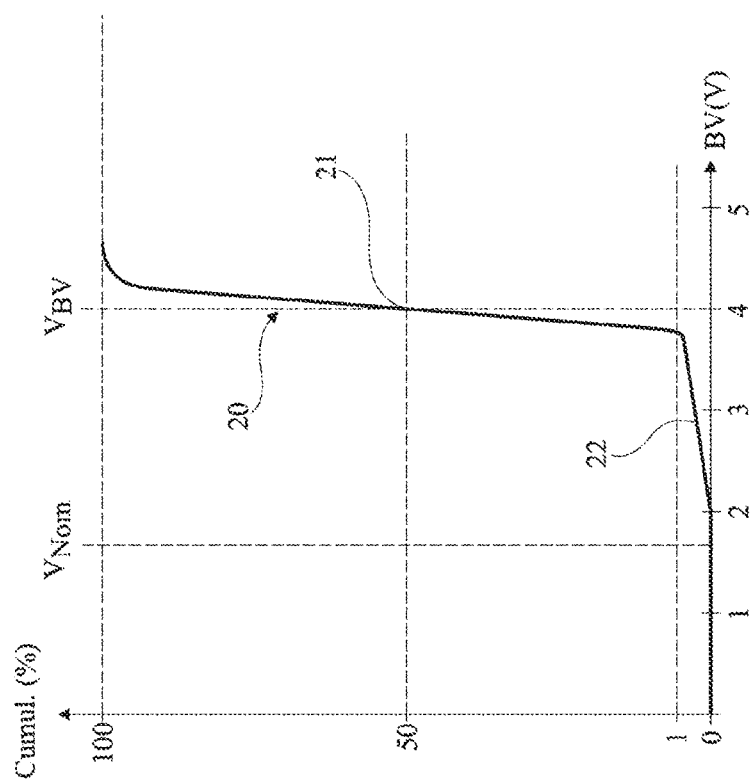
FIG. 1A is a cross-section view of an integrated circuit comprising a MIM capacitor formed in metallization levels.

FIG. 1A is a cross-section view of an integrated circuit 1 comprising a planar metal-insulator-metal capacitor 12, known as a MIM capacitor. The integrated circuit comprises a semiconductor substrate 2 inside and on top of which active components 3, such as MOS transistors, topped with an assembly 4 of metallization levels, have been formed. The assembly 4 includes an intermediary metallization level 5 comprising a copper conductive line portion 6, formed in an insulating layer 7, for example, silicon oxide. A diffusion barrier layer 9, for example, made of silicon nitride, is interposed between metallization level 5 and the next metallization level 11 comprising a planar MIM capacitor 12. This capacitor is formed above a first insulating layer 10, for example, silicon oxide, and comprises two metal electrodes 13 and 15, for example, made of aluminum, between which is arranged an insulating layer 14 forming the capacitor dielectric, for example, a material of high dielectric constant such as tantalum or zirconium oxide. Conductive connections 16 and 17 electrically connect electrodes 13 and 15 to conductive tracks 18 and 19 of metallization level 11.

FIG. 1B shows distribution 20 of the breakdown voltages of a population of capacitors such as illustrated in FIG. 1A, formed on a same wafer. Breakdown voltage BV, in volts, is shown in abscissas, and the cumulative percentage of capacitors having a breakdown voltage smaller than a given value is shown in ordinates. This distribution conventionally comprises a substantially rectilinear quasi-vertical portion 21, illustrating the fact that a majority of capacitors have close breakdown voltages, only slightly scattered around a value $V_{BV}$, linked to the characteristics of dielectric layer 14. Distribution 20 comprises a portion 22 called distribution tail and corresponding to a fraction of capacitors which have substantially smaller breakdown voltages than the rest of the population. Such smaller breakdown voltages result from the inevitable inhomogeneities of capacitors formed on the surface of a wafer, due to local variations of the thickness or of the physico-chemical composition of the dielectric and of the electrodes, or due to the presence of defects in these layers or in the underlying layers. The capacitors of FIG. 1A are used at a nominal voltage $V_{NOM}$ generally much smaller than intrinsic breakdown voltage $V_{BV}$, and it is desirable for distribution tail 22 of the breakdown voltages to be as small as possible since the corresponding capacitors are capable of deteriorating or of breaking down in normal conditions of use.

Planar MIM capacitors such as illustrated in FIG. 1A are in particular very sensitive to the flatness of electrodes. Said flatness in turn depends on the flatness of the underlying layers. A lack of flatness of these layers translates as the forming of a local relief at the electrode level and results in decreasing the breakdown voltage by point effect. Now, the surface of copper lines is known to have randomly-distributed protrusions of variable size and number, corresponding to copper grains in relief, and currently designated as hillocks. Such hillocks, such as that designated with reference numeral 8 at the surface of copper line 6, appear on heating of the substrate during the deposition of diffusion barrier layer 9. It is thus avoided to form planar MIM capacitors immediately above copper lines.

It is here provided to use MIM capacitors such as those described previously to create and store a native code which is pseudo-random, or at least non-deterministic. To achieve this, the previously-described phenomenon according to which MIM capacitors formed above copper lines exhibit disturbances which affect their breakdown voltage is used. Since the distribution of hillocks on a copper line is, by nature, random or at least non-deterministic, the resulting distribution of breakdown voltages will itself be non-deterministic.

Thus, as illustrated in FIG. 2A, where the same reference numerals designate the same elements as in FIG. 1A, planar MIM capacitors are formed above an intermediary metallization level. While, conventionally, it would be carefully avoided to form copper areas in the metallization level immediately under planar MIM capacitors, it is here provided to systematically form copper areas 30 under the capacitors. Thus, hillocks 31, which form randomly at the surface of the copper lines for the previously-discussed reasons, affect the MIM capacitors arranged on top of them. More specifically, electrodes 13 and 15 and dielectric 14 of the MIM capacitors are capable of exhibiting flatness defects which substantially reproduce hillocks 31 of copper lines 30 of the metallization level located immediately under. This results, in some of the MIM capacitors, in areas 32 where insulating layer 14 is thinner and the electrodes are not planar, and where a breakdown is likely to occur for a smaller voltage.

The applicant has carried out various trials by using copper lines extending under an array of MIM capacitors parallel to the rows or columns of this array, to find that, for proper dimensions of copper tracks 30, the breakdown voltage distribution passes from curve 20 shown in FIG. 1B to curve 40 shown in FIG. 2B. As can be seen on this curve, only substantially half (40% in FIG. 2B) of the capacitors have normal breakdown voltage $V_{BV}$ corresponding to that shown in FIG. 1B (portion 41 of curve 40). However, the distribution curve has a marked elbow 42 at the bottom of even distribution 41.

Then, a distribution 43 which strongly deviates from the normal distribution can be observed for approximately 50% of the MIM capacitors. Threshold voltage $V_0$ separating portions 42 and 43 of distribution 40 is generally smaller by at least 10% than voltage $V_{BV}$.

It should be noted, according to the scale indicated in FIG. 2B, that this breakdown voltage variation is very large. For 40% of the capacitors corresponding to portion 41, the breakdown voltage is close to 4 volts. For approximately 50% of the capacitors, the breakdown voltage spreads between 1 and less than 3 volts.

Of course, the distribution curve of FIG. 2B and the previously-indicated values are given as an example only. Those skilled in the art may simply form a test wafer in which they will provide different patterns different from one another by their dimensions, and especially by the width and the step of the copper lines. Then, based on measurements performed on the test wafer, they may, for their specific manufacturing technology, determine the ideal distribution of copper lines 30 providing a breakdown voltage distribution similar to that illustrated in FIG. 2B, where approximately 50% of the MIM capacitors have a breakdown voltage strongly different from the normal breakdown voltage of MIM capacitors in the considered technology. They may also vary the deposition temperature of diffusion barrier 9 to favor the occurrence of hillocks at the surface of the copper lines of metallization level 5. It should be noted that such prior trials are current practice for those skilled in the art in the field of integrated circuit manufacturing, where the forming of test wafers is a normal operation preceding the integrated circuit manufacturing.

In practice, in the context of the previously-described technology, the present inventor has observed that a breakdown voltage distribution of the type in FIG. 2B is obtained in a structure where the copper lines have a width greater than 1 µm, preferably between 2 and 50 µm, the interval between lines being smaller than 0.5 µm, each of the capacitors having lateral dimensions ranging between 2 and 50 µm.

Once an array gathering capacitors of the type in FIG. 2A has been obtained, a pseudo-random code may be obtained by causing a breakdown of all capacitors having a breakdown voltage smaller than a threshold close to voltage threshold $V_0$ indicated in FIG. 2B. This breakdown operation may be performed in one go on all capacitors or by gathering the capacitors in subsets for example corresponding to one or several array lines.

A pseudo-random code of this type would ideally have, in average, as many broken-down capacitors as non-broken down capacitors. However, voltage threshold $V_0$ may slightly fluctuate due to manufacturing parameter dispersions, and can thus deviate the proportions of broken-down capacitors from the ideal 50% proportion. In practice, a code in which the proportion of broken down capacitors ranges between 25 and 75% remains a code usable as an authentication key and it is thus sufficient to select an array of capacitors having a voltage threshold $V_0$ such that from 25 to 75% of the array capacitors have a breakdown voltage smaller than $V_0$.

Figure 3:
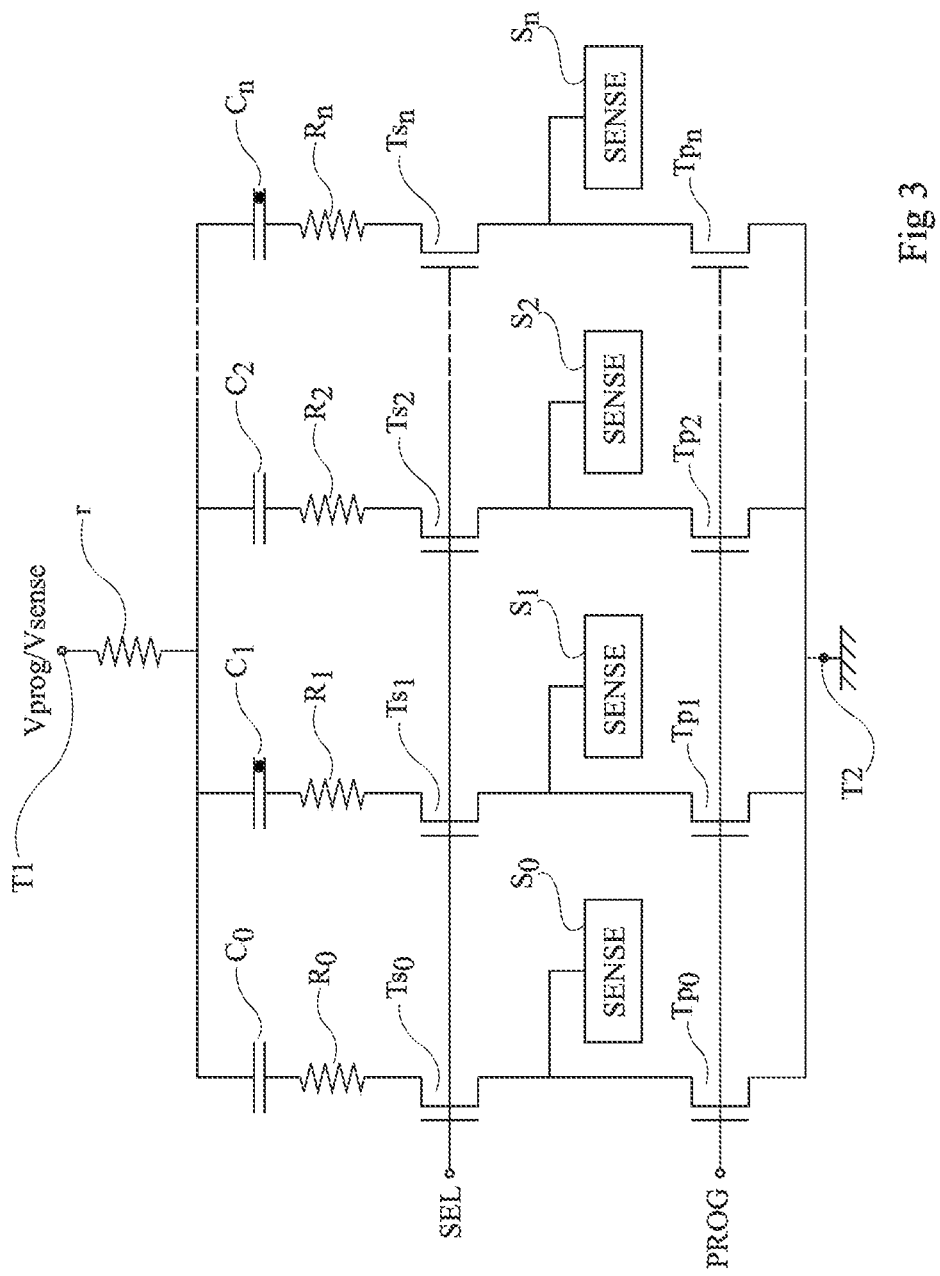
FIG. 3 is an electric diagram illustrating a circuit capable of programming and reading from an array of capacitors.

FIG. 3 shows an example of a programming circuit capable of causing a breakdown of all the capacitors of a set of capacitors having a breakdown voltage smaller than a threshold. For this purpose, all capacitors $C_0, C_1, C_2, \ldots C_n$ of a set of capacitors have their first terminals connected to a terminal T1 via a resistor r. Each of the second terminals of capacitors $C0, C_1, \ldots C_n$ is connected to a second terminal of application of voltage T2 by the series connection of a resistor $R_i$, of a selection transistor $Ts_i$, and of a programming transistor $Tp_i$. In the drawing, the elements assigned to each of capacitors C0, C1, ... $C_n$ have a same index. It should be noted that resistors $R_0, R_1, \ldots R_n$ are of same value, noted R. Further, a read circuit $S_i$ (SENSE) is connected to each of the connection nodes between selection transistor $Ts_i$ and programming transistor $Tp_i$. All selection transistors $Ts_i$ have their gate connected to a same selection terminal SEL. All programming transistors $Tp_i$ have their gate connected to a same programming terminal PROG.

The circuit operates as follows. When a voltage Vprog having a value selected to be close to threshold value $V_0$ indicated in FIG. 2B is applied between terminals T1 and T2, and all transistors $Ts_i$ and $Tp_i$ are on, voltage Vprog can be found across each of capacitors $C_0$ to $C_n$. As a result, a first capacitor, having a low breakdown voltage, will break down. After this, the voltage across each of the capacitors will become a voltage $$V_1 = V\text{prog}/(1+r/R), \text{ or}$$

$$V_1 = V\text{prog}/(1+\alpha)$$

where α designates ratio r/R. Provided to properly select the respective values of r and R to have a small α, voltage $V_1$ is only slightly smaller than voltage Vprog.

The phenomenon repeats and once k capacitors have broken down, the voltage applied across each capacitor becomes $V_k = V\text{prog}/(1+k\alpha)$. Once value $V_k$ becomes smaller than the breakdown voltage of all the transistors which have not broken down yet, the process stops by itself. Voltage $V_k$ must thus not drop too rapidly as k increases. To achieve this, a ratio α=r/R such that, if n is the total number of capacitors, product n·α is smaller than 0.1 will be selected. Then, voltage $V_k$ corresponding to k=n/2 (half of the capacitors have broken down) will be smaller by 5% only than voltage Vprog and will thus remain close to threshold $V_0$.

In practice, the breakdown cascade occurs very fast and advantageously in a single step of application of a voltage Vprog. A code linked to the pseudo-random distribution of the breakdown voltages of the array or of the considered subset of capacitors is thus rapidly and automatically programmed.

Figure 4:
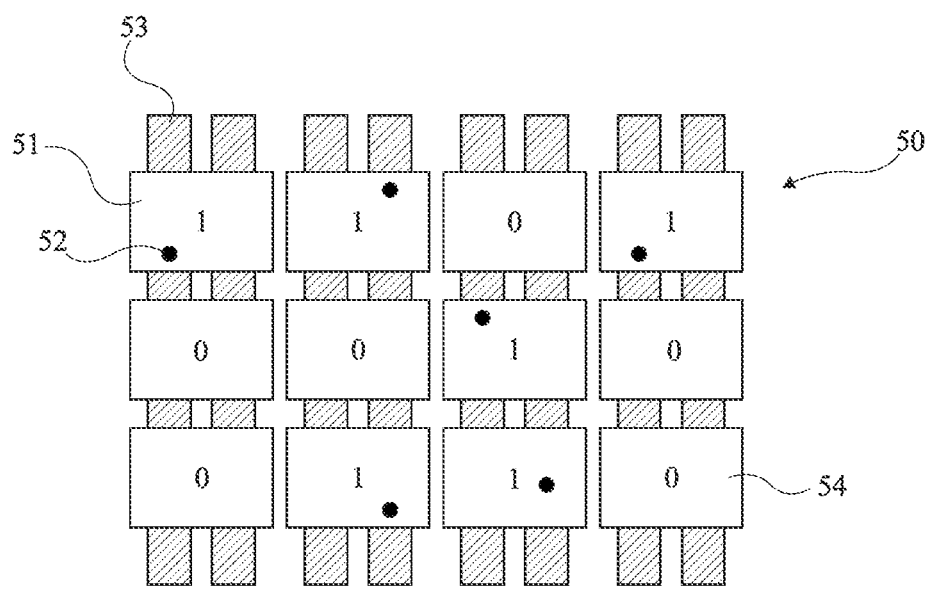
FIG. 4 is a top view of an array of MIM capacitors capable of generating and storing a binary code.

This is illustrated in very simplified manner in FIG. 4 in the case of an array 50 of capacitors comprising 3×4 capacitors, after programming. Some planar MIM capacitors, such as capacitor 51, exhibit a breakdown 52 induced by the presence of a hillock at the surface of copper lines 53 of the metallization level located immediately under. Such broken down capacitors have a low-resistivity electric conduction state and will be assigned binary value 1. Other capacitors have not broken down and have a highly-resistive electric conduction state, and will be assigned binary value 0 (of course, this choice of designations 1 and 0 is purely arbitrary). It should be noted that both states are time-steady and easy to discriminate.

To read the code stored in the capacitor array after programming, a circuit of the type shown in FIG. 3 will be used again. A voltage Vsense is applied between terminals T1 and T2. All selection transistors $Ts_i$ will be turned on, all programming transistors $Tp_i$ will be turned off, and circuits SENSE $S_i$ will enable to detect the state (short-circuited or non short-circuited) of each of the corresponding capacitors $C_i$.

An integrated circuit comprising such as array thus programmed incorporates a native non-deterministic and time-steady binary code.

Of course, the present disclosure is likely to have various alterations, modifications, and improvements which will readily occur to those skilled in the art, especially as concerns the shape of the breakdown voltage distribution curves, the regular or irregular distribution of copper lines under the capacitors, as well as the shape of these lines which may comprise widened portions and/or which may be fragmented.

Similarly, the circuit capable of programming and reading a capacitor array may have many variations. For example, as current in circuits forming memory cell planes, circuits SENSE used to measure the state of the capacitors after breakdown and controls SEL controlling the state of selection transistors $Ts_i$ may be arranged in conventional configurations well known by those skilled in the art as "Bitline/Wordline" configurations. For example, also, resistors $R_i$ may be formed by the internal resistance of selection transistors $Ts_i$.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An integrated circuit structure for storing a native binary code, comprising:
    a metallization network including a plurality of metallization portions;
    an insulating layer positioned on the metallization network; and
    an array of planar MIM capacitors on the insulating layer and directly above the metallization portions, respectively, wherein the metallization portions have dimensions configured to produce breakdown voltages in a first group of the MIM capacitors that are smaller by at least 10% than breakdown voltages in a second group of the MIM capacitors, the first group including from 25 to 75% of the MIM capacitors of the array.

2. The native binary code storage structure of claim 1, wherein said metallization portions correspond to copper lines extending parallel to rows or columns of said array.

3. The native binary code storage structure of claim 2, wherein each MIM capacitor is directly above from two to five of the copper lines.

4. The native binary code storage structure of claim 2, wherein the copper lines have a width greater than 1 µm and are separated from each other by an interval smaller than 0.5 µm, each of the capacitors having lateral dimensions ranging between 2 and 50 µm.

5. The native binary code storage structure of claim 1, wherein at least one subset of the MIM capacitors having respective first electrodes that are interconnected.

6. The native binary code storage structure of claim 5, wherein said subset corresponds to a row or to a column of the array.

7. The native binary code storage structure of claim 5, further comprising:
    a plurality of selection transistors; and
    a plurality of resistors having substantially the same resistance values, wherein the MIM capacitors have respective second electrodes electrically coupled to the selection transistors, respectively, via the resistors, respectively.

8. A method, comprising:
    forming integrated circuit structure for storing a native binary code, the forming including:
    forming a copper metallization network including a plurality of metallization portions;
    forming an insulating layer positioned on the copper metallization network; and
    forming an array of planar MIM capacitors on the insulating layer and directly above the metallization portions, respectively, wherein the metallization portions have dimensions configured to produce breakdown voltages in a first group of the MIM capacitors that are smaller by at least 10% than breakdown voltages in a second group of the MIM capacitors, the first group including from 25 to 75% of the MIM capacitors of the array.

9. The method of claim 8, comprising:
    programming the native binary code in the integrated circuit structure, the programming including:
    commonly connecting at least one subset of the MIM capacitors of said array, in a circuit configured to cause a breakdown of the MIM capacitors in the first group.

10. The method of claim 8, comprising:
    electrically coupling first electrodes of the capacitors to a first terminal of a voltage source through a common resistor;
    electrically coupling second electrodes of each of the capacitors to a second terminal of the voltage source, via individual resistors; and
    applying between the first and second terminals a voltage ranging between breakdown voltages of the MIM capacitors of the first group and breakdown voltages of said MIM capacitors of the second group.

11. The method of claim 10, wherein the number of MIM capacitors multiplied by a ratio between a value of the common resistor and a value of one of the individual resistors is smaller than 0.1.

12. A secure system comprising:
    a structure configured to store a native binary code, the structure including:
        a metallization network including a plurality of metallization portions;
        an insulating layer positioned on the metallization network; and
        an array of planar MIM capacitors on the insulating layer and directly above the metallization portions, respectively, wherein the metallization portions have dimensions configured to produce breakdown voltages in a first group of the MIM capacitors that are smaller by at least 10% than breakdown voltages in a second group of the MIM capacitors, the first group including from 25 to 75% of the MIM capacitors of the array; and
    a programming circuit configured to cause the MIM capacitors of the first group to breakdown.

13. The system of claim 12, wherein said metallization portions correspond to copper lines extending parallel to rows or columns of said array.

14. The system of claim 13, wherein each MIM capacitor is directly above from two to five of the copper lines.

15. The system of claim 13, wherein the copper lines have a width greater than 1 µm and are separated from each other by an interval smaller than 0.5 µm, each of the capacitors having lateral dimensions ranging between 2 and 50 µm.

16. The system of claim 12, wherein at least one subset of the MIM capacitors having respective first electrodes that are interconnected.

17. The system of claim 16, wherein said subset corresponds to a row or to a column of the array.

18. The system of claim 16, wherein the programming circuit includes:
    a plurality of selection transistors; and
    a plurality of resistors having substantially the same resistance values, wherein the MIM capacitors have respective second electrodes electrically coupled to the selection transistors, respectively, via the resistors, respectively.

19. A method, comprising:
    identifying a native binary code stored in an integrated circuit structure that includes:
        a metallization network including a plurality of metallization portions;
        an insulating layer positioned on the metallization network; and
        an array of planar MIM capacitors on the insulating layer and directly above the metallization portions, respectively, wherein the metallization portions have dimensions configured to produce breakdown voltages in a first group of the MIM capacitors that are smaller by at least 10% than breakdown voltages in a second group of the MIM capacitors, the first group including from 25 to 75% of the MIM capacitors of the array; and, wherein the identifying includes:
        applying a voltage to the array of planar MIM capacitors;
        measuring at least one electrical quantity of the array while the voltage is applied to the array, the at least one electrical quantity reflecting breakdown states of the MIM capacitors of the array.

20. The method of claim 19, comprising:
    electrically coupling first electrodes of the capacitors to a first terminal of a voltage source through a common resistor;
    electrically coupling second electrodes of each of the capacitors to a second terminal of the voltage source, via individual resistors;
    electrically coupling the second electrodes of the capacitors to sense amplifiers, respectively, wherein:
    applying the voltage includes applying between the first and second terminals a voltage ranging between a breakdown voltages of the MIM capacitors of the first group and breakdown voltages of said MIM capacitors of the second group; and
    the measuring includes measuring the at least one electrical quantity using the sense amplifiers.

* * * * *